United States Patent
Maruyama et al.

(10) Patent No.: US 6,692,845 B2
(45) Date of Patent: Feb. 17, 2004

(54) LIGHT-EMITTING DEVICE

(75) Inventors: Junya Maruyama, Kanagawa (JP); Hisao Ikeda, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/852,270

(22) Filed: May 10, 2001

(65) Prior Publication Data

US 2001/0041270 A1 Nov. 15, 2001

(30) Foreign Application Priority Data

May 12, 2000 (JP) ........................................ 2000-141035

(51) Int. Cl.[7] .............................................. H05B 33/00
(52) U.S. Cl. ..................... 428/690; 428/917; 313/502; 313/506; 313/509; 257/88; 257/93; 257/100
(58) Field of Search .......................... 257/93, 88, 100; 428/690, 917; 313/502, 509, 506; 427/66

(56) References Cited

U.S. PATENT DOCUMENTS

| | | | | |
|---|---|---|---|---|
| 6,150,668 A | * | 11/2000 | Bao et al. | 257/40 |
| 6,194,119 B1 | * | 2/2001 | Wolk et al. | 430/200 |
| 6,320,322 B1 | | 11/2001 | Tanaka | 315/169.3 |
| 6,537,687 B1 | | 3/2003 | Nii | 428/690 |
| 6,551,723 B1 | | 4/2003 | Okada et al. | 428/690 |
| 2002/0113248 A1 | | 8/2002 | Yamagata et al. | 257/187 |
| 2002/0185967 A1 | * | 12/2002 | Friend | 313/504 |

FOREIGN PATENT DOCUMENTS

| | | |
|---|---|---|
| EP | 0 993 235 A2 | 4/2000 |
| JP | 11-271753 | 10/1999 |

OTHER PUBLICATIONS

Kido J. et al., "Bright blue electroluminescence from poly (N–vinylcarbazole)", App. Phys. Lett. 63 (19), Nov. 8, 1993, pp. 2627–2629.

S. Miyashita et al.; "Full Color Displays Fabricated by Ink–Jet Printing"; *Asia Display* / IDW '01; pp. 1399–1402; 2001.

* cited by examiner

Primary Examiner—Cynthia H. Kelly
Assistant Examiner—Dawn Garrett
(74) Attorney, Agent, or Firm—Fish & Richardson P.C.

(57) ABSTRACT

The present invention provides a technique for performing film-forming of a cathode comprising a metallic with a good adhesion, as well as a light-emitting device producing a good image to be displayed. An EL element is fabricated to have a structure in which an electron transport layer comprising a low molecular weight film is provided on a luminescent layer (104) comprising a polymer film and a cathode (106) comprising a metallic film is provided on the resultant electron transport layer. With such structure, occurrence of delamination or a dark spot derived from inferior adhesion of the cathode (106) can be prevented to obtain the light-emitting device producing a good image quality.

24 Claims, 9 Drawing Sheets

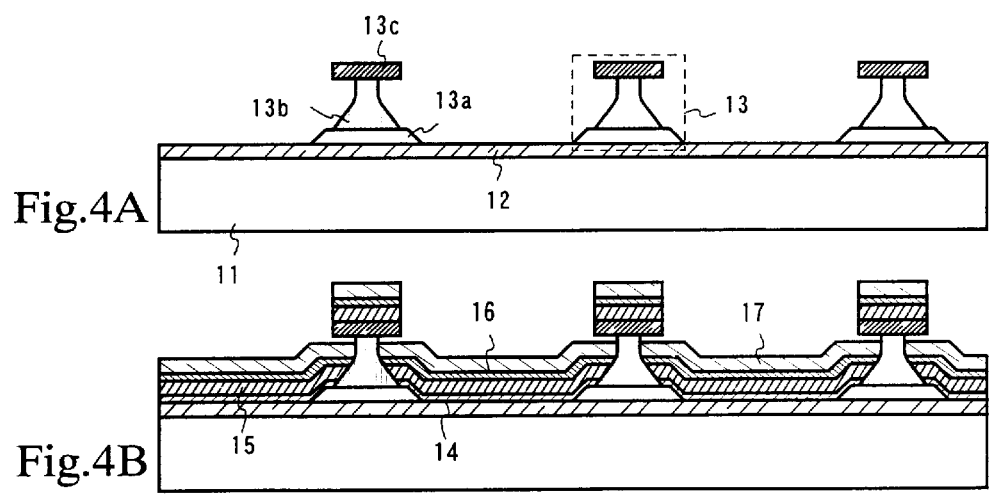

LIGHT-EMITTING DEVICE

BACKGROUND OF THE INVENTION

1. Field of the Invention

The present invention relates to light-emitting devices. More particularly, the present invention pertains to a light-emitting device comprising an element (hereinafter referred to as "EL element") in which a thin film of a light-emitting organic material (hereinafter referred to as "organic EL film") that can attain electro luminescence (hereinafter also referred to as "EL") is interposed between an anode and a cathode. Examples of such light-emitting devices according to the present invention include an organic EL display and an organic light-emitting diode (also referred to as "OLED" in short).

Light-emitting materials which can be used in the present invention encompass all light-emitting materials that can emit light (phosphorescence and/or fluorescence) via at least one of a singlet excitement and a triplet excitement.

2. Description of the Related Art

Since Eastman Kodak Co. announced that a light-emitting device using an organic EL film had emitted light at a low drive voltage, the light-emitting device using the organic EL film has been noticed. According to an announcement by Eastman Kodak Co., it is characteristic to decrease the drive voltage by taking a laminate element structure; therefore, many companies have conducted research and development on such laminate element structure.

Though the organic EL film is individually used as a luminescent layer in some cases, it, ordinarily, forms an EL element in combination with an organic material such as a hole injection layer, a hole transport layer, an electron transport layer or an electron injection layer. On this occasion, the organic EL film includes a polymer-typed organic EL film and a low molecular weight-typed (monomer-typed) organic EL film.

Generally, in the present specification, polymer-typed organic materials are referred to as polymer films whereas low molecular weight-typed organic materials as low molecular weight films so that polymer-typed organic EL films are the polymer films whereas low molecular weight-typed organic EL films are the low molecular weight films.

Now, a structure of the EL element, on which the present inventors has run a test, is shown in FIG. 2. In FIG. 2, an anode 202 comprising an indium tin oxide (ITO) film is provided on a substrate 201; on the thus provided anode 202, provided are a hole injection layer 203 comprising polythiophene (PEDOT), a luminiscent layer 204 comprising poly(p-phenylenevinylene) (PPV) and a cathode 205 comprising a metallic film in sequence in a direction of departing from the anode 202.

As a result of a careful observation by the present inventors on the EL element of a trial production with the structure shown in FIG. 2, many pinholes and delaminations were found in the cathode 205. Further, it was found that such pinholes and the like had caused a dark spot (deteriorated portion in black dot form) of the EL element. That is, the dark spot derived from a defect of film formation of the cathode 205 has remarkably deteriorated a displayed image quality.

The present inventors have considered that such pinholes or delaminations of the cathode 205 are caused by a poor adhesion between the luminiscent layer 204 comprising the polymer film and the cathode 205 comprising the metallic film. That is, the present inventors have considered that, since the polymer film such as PPV is hydrophobic, it shows a poor adhesion with the metallic film thereby causing a pinhole or delamination at the time of the film formation of the cathode 205.

SUMMARY OF THE INVENTION

Under such circumstances, it is an object of the present invention to provide a technique for forming a film of a cathode comprising a metallic film with a good adhesion in an EL element with a polymer film as a light-emitting layer or an electron transport layer. It is another object of the present invention to provide a light-emitting device with a favorable displayed image quality to be produced by utilizing the technique.

The present inventors have considered that the adhesion can be improved by not performing a film formation of the metallic film directly on a polymer film but by providing a low molecular weight film on the polymer film as a buffer for the purpose of improving the adhesion and then providing the metallic film on the thus provided low molecular weight film.

That is, when a luminescent layer is the polymer film, the low molecular weight film is provided as an electron transport layer or an electron injection layer and then the cathode comprising the metallic film may be provided on the thus provided low molecular weight film. Further, when the electron transport layer is the polymer layer, the low molecular weight layer is provided as the electron injection layer and then the cathode comprising the metallic film may be provided on the thus provided low molecular weight film.

BRIEF DESCRIPTION OF THE DRAWINGS

FIGS. 4A and 4B show a method of fabricating a light-emitting device according to the present invention;

DETAILED DESCRIPTION OF THE PREFERRED EMBODIMENT

Figure 1:
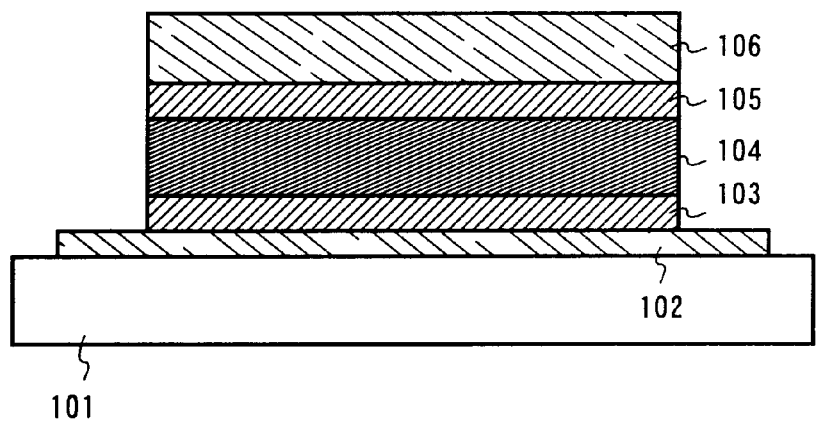
FIG. 1 shows a structure of an EL element according to the present invention.

A structure of an EL element according to the present invention is shown in FIG. 1. In FIG. 1, a reference numeral 101 denotes an insulating body. The insulating body indicates an insulating substrate, a substrate provided with an insulating film on a surface thereof, or an insulating film. Therefore, in a case of an active matrix-typed light-emitting device, when the EL element is formed on an interlayer insulating film provided on a semiconductor element, the interlayer insulating film corresponds to the insulating body.

The reference numeral 102 denotes an anode which is an electrode for injecting a hole into an organic EL film to be a luminiscent layer. As the anode 102, an oxide conductive film (represented by a conductive film composing any one of indium oxide, tin oxide, zinc oxide, a compound of indium oxide and tin oxide or a compound of indium oxide and zinc oxide) may be used.

The reference numeral 103 denotes a hole injection layer comprising an organic material or an inorganic material and can use a thin film comprising a material such as copper phthalocyanine (CuPc), polythiophene (PEDOT), polyaniline (PAni) and a starburst amine (MTDATA).

The reference numeral 104 denotes a luminiscent layer composing a polymer film and can use a known polymer-typed organic EL film comprising poly(p-phenylenevinylene) (PPV), polyvinylcarbazole (PVK), polyfluorene or the like.

The reference numeral 105 denotes an electron transport layer comprising a low molecular weight film and can use a known material such as a tris(8-quinolinolato)aluminum complex ($Alq_3$), 1,2,4-triazole (TAZ), an oxadiazole derivative (TPOB), a beryllium complex ($BeBq_2$) and a silol derivative (PySPy).

The reference numeral 105 may be an electron injection layer comprising the low molecular weight film or a laminate of the electron transport layer and the electron injection layer. As the electron injection layer, a known inorganic material such as lithium fluoride (LiF), barium oxide (BaO) and lithium oxide (LiO) can be used.

Further, the reference number 106 denotes a cathode comprising a metallic film, and a metallic film comprising an element which belongs to Group I or Group II in the Periodic Table (alkali metal element or alkali earth metal element) can be typically used. On this occasion, an aluminum thin film, a copper thin film or a silver thin film may be used as the metallic film. Alternatively, a bismuth (Bi) film may be permissible.

In the EL element with a structure shown in FIG. 1, it is considered the cathode 106 has a good adhesion since the electron transport layer 105 comprising the low molecular weight film is formed on the luminiscent layer 104 comprising the polymer film and then the cathode 106 comprising the metallic film is formed on the thus formed electron transport layer 105.

As described above, since the adhesion of the cathode is enhanced by allowing the EL element to have an element structure according to the present invention, delamination of the cathode comprising the metallic film and generation of a pinhole and other imperfections can be prevented. When the pinhole is generated, there is a danger that moisture or oxygen which enters through the pinhole may react with an organic EL film thereby deteriorating the organic EL film. The present invention can prevent a cause of such deteriorating so that the light-emitting device with little image defect can be obtained.

Now, the present invention will be described below in further detail with reference to embodiments.

EXAMPLE 1

Figure 3:
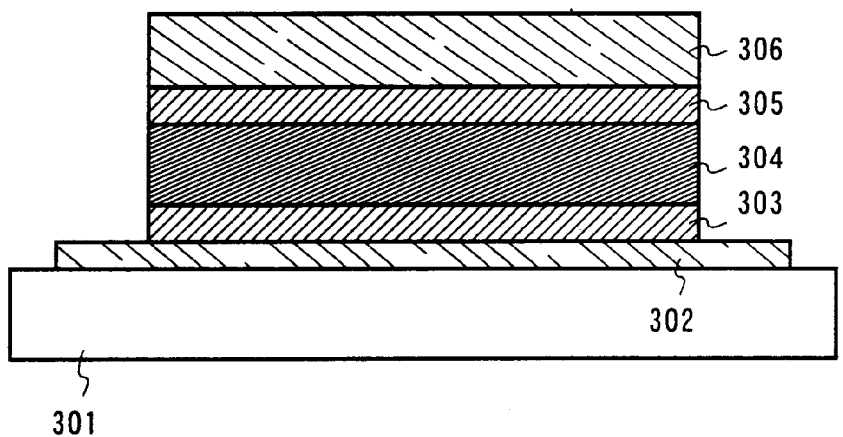
FIG. 3 shows another structure of the EL element according to the present invention.

The present inventors have actually fabricated an EL element with a structure shown in FIG. 3 on a trial basis. In FIG. 3, the reference numerals 301, 302, 303, 304, 305 and 306 denote a glass substrate, an anode comprising an indium tin oxide (ITO) film, a hole injection layer comprising a PEDOT film, a luminiscent layer comprising a PPV film, an electron transport layer comprising an $Alq_3$ film and a cathode comprising an aluminum alloy (Al—Li alloy) film comprising lithium, respectively.

Figure 2:
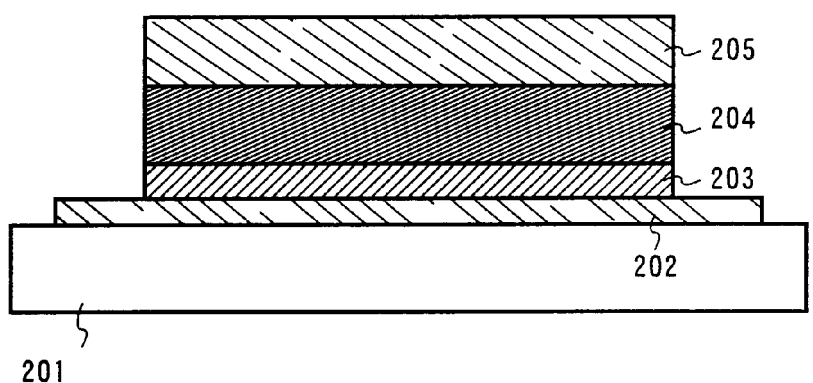
FIG. 2 shows a structure of a conventional EL element.

As a result of a careful observation while the EL element with the structure shown in FIG. 3 was allowed to actually emit light, it was able to confirm that such EL element had a lower number of dark spots than the EL element with a conventional structure shown in FIG. 2.

EXAMPLE 2

In the present embodiment, a case in which the present invention has been executed to a passive matrix-typed light-emitting device is described. On this occasion, FIG. 4A is used for an explanation thereof.

Firstly, as shown in FIG. 4A, an anode 12 comprising an oxide conductive film is formed on a substrate 11 which has preliminarily been provided with an insulating film on a surface thereof and, then, a barrier 13 is formed on the thus formed anode 12. The barrier 13 is composed of a first barrier 13a comprising a silicon oxide film, a second barrier 13b comprising a resin film and a third barrier 13c comprising a silicon nitride film.

On this occasion, the first barrier 13a may be subjected to patterning with photolithography. The second and third barriers 13b and 13c can be prepared first by subjecting a resin film to become the second barrier 13b and another resin film to become the third barrier 13c to etching processing so that they have a same form with each other and subsequently by subjecting the thus etched resin film to become the second barrier 13b to isotropical etching processing while making use of the thus etched third barrier 13c as a mask.

Next, after a surface of the anode 12 has been subjected to ozone processing, a hole injection layer 14 comprising a polymer film, a luminescent layer 15 comprising another polymer film and an electron transport layer 16 comprising a low molecular weight film are formed in sequence. Subsequently, an Al—Li alloy film is formed as a cathode 17 and known sealing processing is performed to complete a passive matrix-typed light-emitting device.

Further, the present embodiment may optionally be combined with at least any one of the structures described in Summary of the Invention and Example 1 in the present specification.

EXAMPLE 3

In the present embodiment, a case in which the present invention has been executed to an active matrix-typed light-emitting device is described. On this occasion, FIGS. 5A to 5C are used for an explanation thereof.

Figures 5A, 5B, 5C:
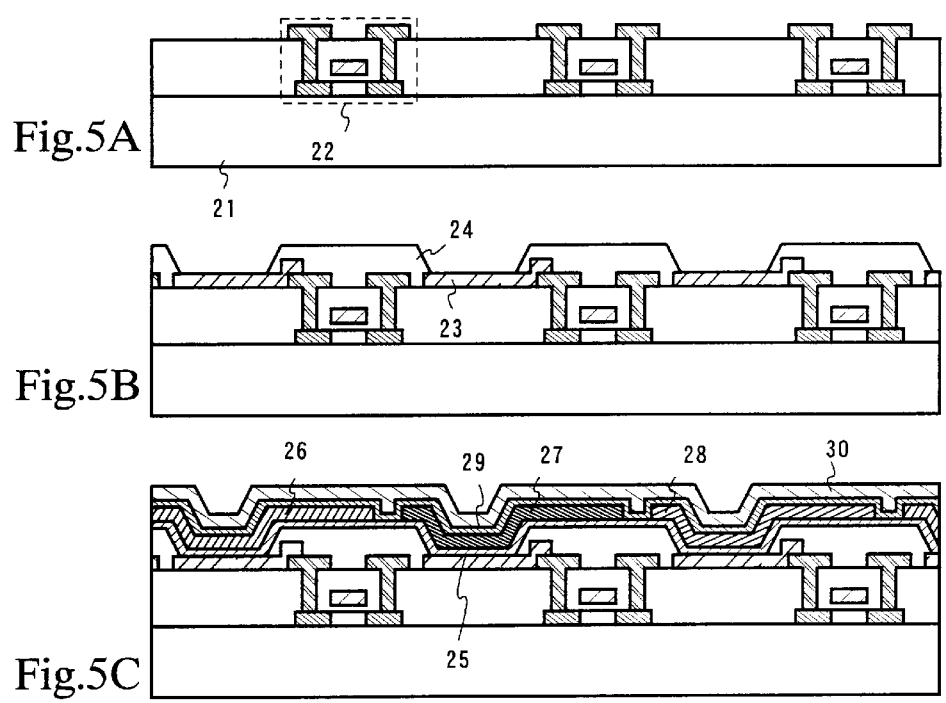
FIGS. 5A to 5C show another method of fabricating the light-emitting device according to the present invention.

As FIG. 5A shows, a thin film transistor (hereinafter referred to as TFT) 22 is formed in accordance with a known fabrication step on a substrate 21 which has preliminarily been provided with an insulating film on a surface thereof. Subsequently, as FIG. 5B shows, an anode 23 composed of an oxide conductive film and an insulating film 24 comprising a silicon oxide film are formed.

Next, after a surface of the anode 23 is subjected to ozone processing, a hole injection layer 25 comprising a polymer film, luminescent layers 26 to 28 each comprising a polymer film, and an electron transport layer 29 comprising a low molecular weigh film are formed in sequence. On this occasion, the luminescent layers 26, 27 and 28 correspond to emitting for red color, blue color forming and green color forming, respectively.

Subsequently, an Al—Li alloy film is formed as a cathode 30 and, then, a known sealing process is performed to complete an active matrix-typed light-emitting device.

Further, the present embodiment may optionally be combined with any one of the structures described in Summary of the Invention and Example 1 in the present specification.

EXAMPLE 4

In the present embodiment, a case in which the present invention has been executed to another active matrix-typed light-emitting device further comprising an arrangement that prevents degassing through an interlayer insulating film is described. On this occasion, FIGS. 6A to 6C are used for an explanation thereof.

Figure 6A:
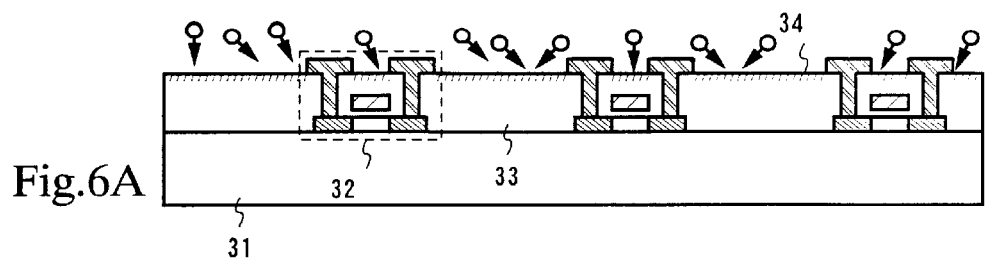
FIGS. 6A to 6C show still another method of fabricating the light-emitting device according to the present invention.
Figure 6B:
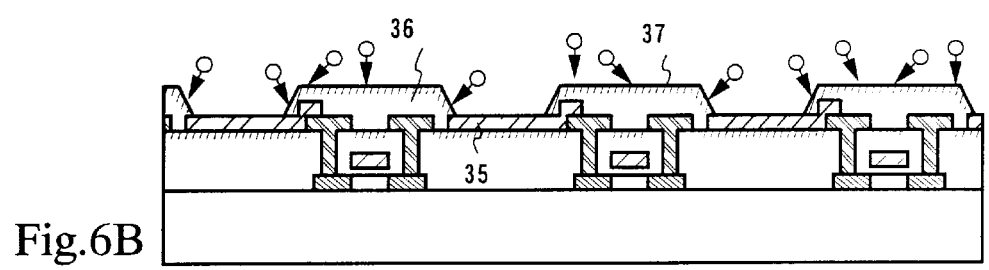
Figure 6C:
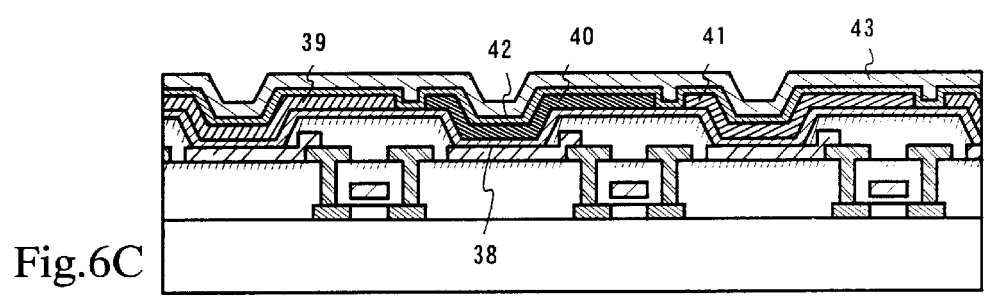

As FIG. 6A shows, a thin film transistor (hereinafter referred to as TFT) 32 is formed in accordance with a known fabrication step on a substrate 31 which has preliminarily been provided with an insulating film on a surface thereof. In the present embodiment, a resin film (e. g., acrylic film, polyimide film, polyamide film or polyimide-amide film) is used as an interlayer insulating film 33. Further, after forming the TFT, first plasma processing is performed on the interlayer insulating film 33.

In the present embodiment, a plasma is formed in hydrogen, nitrogen, a hydrocarbon, carbon halide, hydrogen fluoride or a rare gas; the interlayer insulating film 33 is exposed to the thus formed plasma to perform the first plasma processing thereon.

As a result of the first plasma processing, an uppermost surface (including a portion with a 5 nm depth from the surface) of the interlayer insulting film 33 is modified in a self-alignment manner by using an electrode as a mask to form a hardened (densified) resin layer (hereinafter referred to as hardened layer) 34. Thus, the interlayer insulating film with the uppermost surface thereof comprising the hardened resin (a composite including the resin film 33 and the hardened layer 34) is formed.

Firstly, with performing the first plasma processing, degassing through the interlayer insulating film 33 can be prevented.

Secondly, as FIG. 6B shows, an anode (pixel electrode) 35 comprising an oxide conductive film and a resin film 36 are formed. The resin film 36 is provided to cover a periphery of the anode 35 and has an opening on a portion except such periphery of the anode 35. In the present embodiment, after forming the opening (i.e., after the resin film is subjected to patterning), second plasma processing is performed. The second plasma processing is performed under the same condition as in the first plasma processing.

As a result of the second plasma processing, an uppermost surface of the resin film 36 is modified to form a hardened (densified) resin layer 37. Thus, a resin film (a composite including the resin film 36 and the hardened layer 37) with the hardened uppermost surface is formed. With performing such second plasma processing, degassing through the resin film 36 can be prevented.

As the insulating film for covering the periphery of the anode 35, an inorganic film such as a silicon nitride film, a silicon oxide film or other appropriate inorganic films can also be used in place of the resin film. When such an inorganic film is used, there is no danger of degassing and the second plasma processing becomes unnecessary.

Next, after a surface of the anode 35 is subjected to ozone processing, a hole injection layer 38 comprising a polymer film, luminescent layers 39 to 41 comprising other polymer films and an electron transport layer 42 comprising a low molecular weight film are formed in sequence. Luminescent layers 39, 40 and 41 correspond to emission of a red color, a blue color and a green color forming, respectively; such layers are formed by a technique of printing.

Subsequently, an Al—Li alloy film is formed as a cathode 43 and, then, known sealing processing is performed to complete an active matrix-typed light-emitting device.

Further, the present embodiment may optionally be combined with one of the structures described in Summary of the Invention and Example 1 in the present specification.

EXAMPLE 5

In the present embodiment, a case in which the present invention has been executed to another active matrix-typed light-emitting device further comprising a structure that prevents degassing through an interlayer insulating film is described. On this occasion, FIGS. 7A to 7C are used for the description thereof.

Figure 7A:
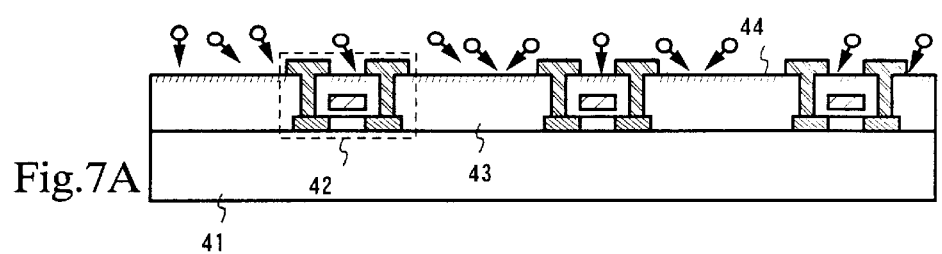
FIGS. 7A to 7C shows a further method of fabricating the light-emitting device according to the present invention.
Figure 7B:
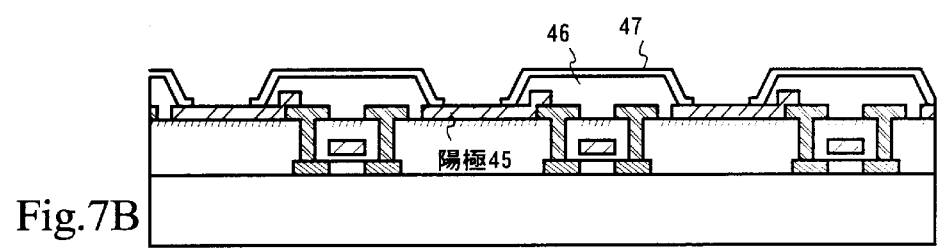
Figure 7C:
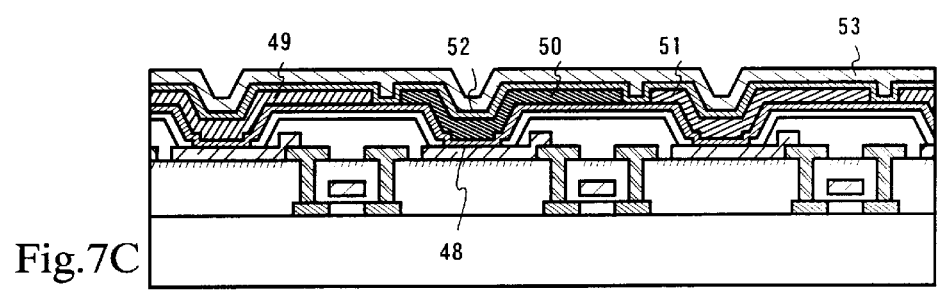

As FIG. 7A shows, a thin film transistor (hereinafter referred to as TFT) 42 is formed in accordance with a known fabrication step on a substrate 41 which has preliminarily been provided with an insulating film on a surface thereof. In the present embodiment, a resin film (e. g., acrylic film, polyimide film, polyamide film or polyimide-amide film) is used as the interlayer insulating film 43. Further, after forming TFT 42, plasma processing is performed on the interlayer insulating film 43.

In the present embodiment, a plasma is formed in hydrogen, nitrogen, a hydrocarbon, a carbon halide, hydrogen fluoride or a rare gas; the interlayer insulating film 43 is exposed to the thus formed plasma to perform the plasma processing.

As a result of the plasma processing, an uppermost surface (including a portion with a 5 nm depth from the surface) of the interlayer insulating film 43 is modified in a self-alignment manner by using an electrode as a mask to form a hardened (densified) resin layer (hardened layer) 44. Thus, the interlayer insulating film having the uppermost surface thereof comprising a hardened resin (a composite including the resin film 43 and the hardened layer 44) is formed.

Firstly, with performing the plasma processing, degassing through the interlayer insulating film 43 can be prevented.

Secondly, as FIG. 7B shows, an anode (pixel electrode) 45 comprising an oxide conductive film and a resin film 46 are formed. The resin film 46 is provided to cover a periphery of the anode 45 and has an opening on a portion except such periphery of the anode 45. In the present embodiment, after forming the opening (i.e., after the resin film is subjected to patterning), a protective film (typically, amorphous carbon film or silicon nitride film) 47 is formed.

In the present embodiment, an amorphous carbon film (specifically, diamond-like carbon film) is used as the protective film 47. The protective film 47 comprising the amorphous carbon film used in the present embodiment is a carbon film with similar hardness to that of diamond and has a passivation effect to effectively prevent moisture, oxygen or other materials from entering therethrough. In the present invention, after the amorphous carbon film 47 is formed by a technique of plasma CVD, the thus formed film 47 is subjected to patterning to form, on the anode 45, an opening with a smaller bore diameter than that of the above-described resin film 46 on the anode 45.

By taking a structure as shown in FIG. 7B, an uppermost surface of the resin film 46 is entirely covered by the protective film 47 so that degassing through the resin film 46 can be prevented. The amorphous carbon film 47 is permissible as long as it is formed in a thickness of from 5 nm to 20 nm.

Next, after a surface of the anode 45 is subjected to ozone processing, a hole injection layer 48 comprising a polymer film, luminescent layers 49 to 51 each comprising a polymer film and an electron transport layer 52 comprising a low molecular weight film are formed in sequence. On this occasion, luminescent layers 49, 50 and 51 correspond to emission of a red color, a blue color and a green color, respectively; such layers are each formed by a technique of printing.

Subsequently, an Al—Li alloy film is formed as a cathode 53 and, then, known sealing processing is performed to complete an active matrix-typed light-emitting device.

Further, the present embodiment may optionally be combined with one of the structures described in Summary of the Invention and Example 1 in the present specification. The present embodiment has a structure that prevents degassing through the interlayer insulating film 43 in the same manner as in Example 4; however, it may take a structure in which a film with the same passivation effect as the protective film 47 is provided on the interlayer insulating film 43.

EXAMPLE 6

In Example 4, the first plasma processing is performed to the interlayer insulating film 33; however, when the uppermost surface of the interlayer insulating film 33 is not exposed, that is, when the anode 35 and the resin film 36 are provided thereon to cover the entire uppermost surface, the first plasma processing can be omitted.

Further, in Example 5, the plasma processing is performed to the interlayer insulating film 43; however, when the uppermost surface of the interlayer insulating film 43 is not exposed, that is, when the anode 45 and the resin film 46 are provided thereon to cover the entire uppermost surface, the plasma processing can be omitted.

On this occasion, the present embodiment may optionally be combined with at least any one of the structures described in Summary of the Invention, Example 1, Example 4 and Example 5 of the present specification.

EXAMPLE 7

In the present embodiment, a case, in which the present invention has been executed as an active matrix-typed light-emitting device, is described. In each of Example 3 to Example 5, an example of fabricating a top gate-typed TFT (specifically, planar-type TFT) as a TFT is illustrated, while, in the present, a bottom gate-type TFT (specifically, inverse stagger-typed TFT) is used.

Since the present embodiment has the same arrangement as those of Example 3 to Example 6 except for the above, a detailed description in the present embodiment is omitted.

EXAMPLE 8

The light-emitting device fabricated in accordance with the present invention is of the self-emission type, and thus exhibits more excellent visibility of the display image in a light place as compared to the liquid crystal display device. Furthermore, the self-emission device has a wider viewing angle. Accordingly, the light-emitting device can be applied to a display portion in various electric apparatuses.

Such electric apparatuses of the present invention include a video camera, a digital camera, a goggle-type display (head mount display), a car navigation system, a sound reproduction equipment, a note-size personal computer, a game machine, a portable information terminal (a mobile computer, a portable telephone, a portable game machine, an electronic book, or the like), an image reproduction device including a recording medium. FIGS. 8 and 9 show specific examples of such electric apparatuses.

Figure 8A:
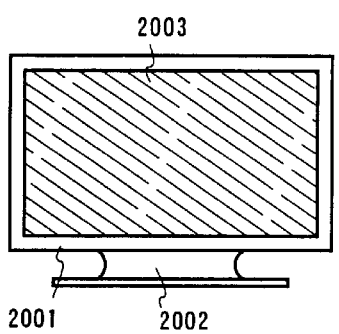
FIGS. 8A to 8F each shows an embodiment of an electric appliance.

FIG. 8A illustrates an EL display, which includes a frame 2001, a support table 2002, a display portion 2003, or the like. The light emission module of the present invention is applicable to the display portion 2003. The light emission module of the present invention is used for the display portion, thereby visibility of the EL display can be improved and the power consumption can be reduced.

Figure 8B:
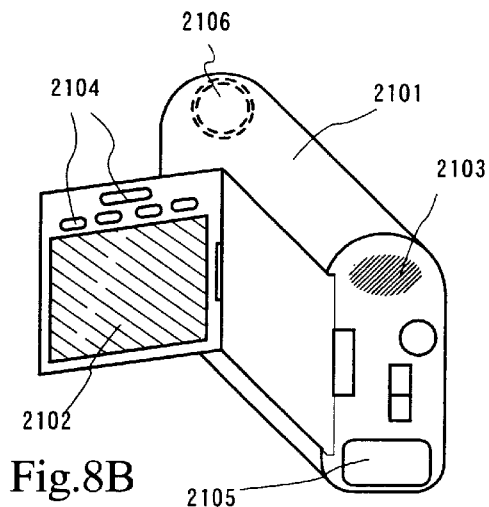

FIG. 8B illustrates a video camera, which includes a main body 2101, a display portion 2102, an audio input portion 2103, operation switches 2104, a battery 2105, an image receiving portion 2106, or the like. The light emission module in accordance with the present invention can be used as the display portion 2102.

Figure 8C:
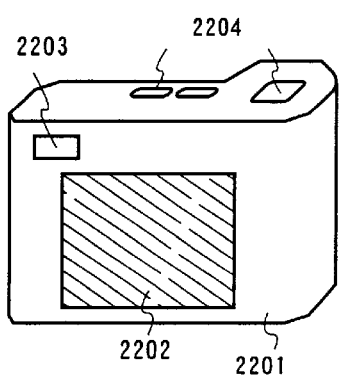

FIG. 8C illustrates a digital camera, which includes a main body 2201, a display portion 2202, a view finder portion 2203, operation switches 2204. The light emission module of the present invention is applicable to the display portion 2202.

Figure 8D:
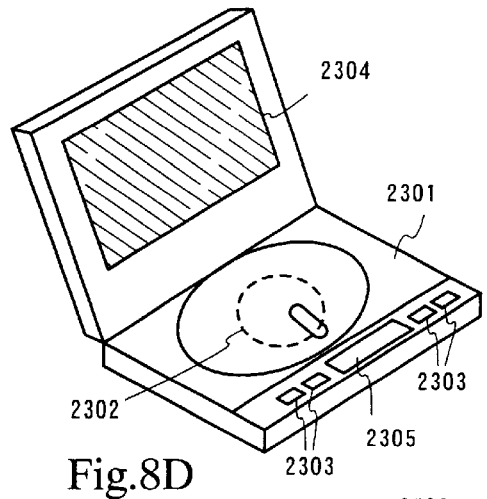

FIG. 8D illustrates an image reproduction apparatus including a recording medium (more specifically, a DVD reproduction apparatus), which includes a main body 2301, a recording medium (CD, LD, DVD or the like) 2302, operation switches 2303, a display portion (a) 2304, another display portion (b) 2305, or the like. The display portion (a) is used mainly for displaying image information, while the display portion (b) is used mainly for displaying character information. The light-emission module in accordance with the present invention can be used as these display portions (a) and (b). The image reproduction apparatus including a recording medium further includes a CD reproducing device, game machine or the like.

Figure 8E:
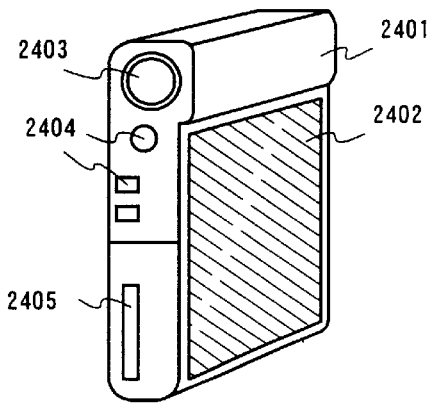

FIG. 8E illustrates a portable (mobile) computer, which includes a main body 2401, a display portion 2402, an image receiving portion 2403, operation switches 2404, and a memory slot 2405. The light-emitting module of the present invention can be used as the display portion 2402. This portable computer can record or play back information in the recording medium which is an accumulation of flash memory or nonvolatile memory.

Figure 8F:
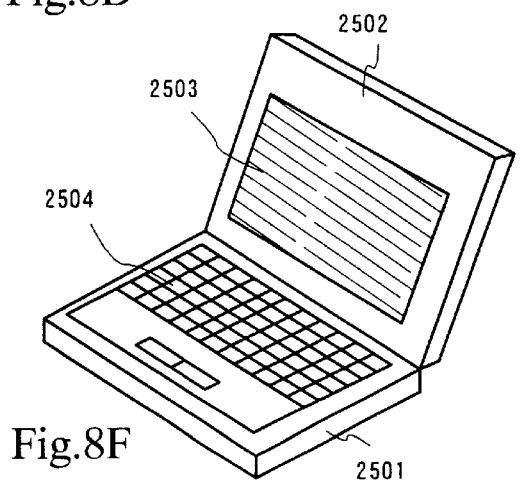

FIG. 8F illustrates a personal computer, which includes a main body 2501, a casing 2502, a display portion 2503, and a keyboard 2504. The light-emitting module of the present invention can be used as the display portion 2503.

Further, the above electric apparatuses often display information transmitted through an electronic telecommunication line such as the Internet and CATV (cable TV), and particularly situations of displaying moving images is increasing. In the case where a light-emitting device having EL elements in the display portion is used, it is possible to perform animation display without delay since the response speed of EL elements is very high.

In addition, since the light-emitting device consumes power in the light-emitting portion, it is preferable to display information so as to make the light emitting portion as small as possible. Consequently, when using the light-emitting device in a display portion mainly for character information, such as in a portable information terminal, in particular a portable telephone or an audio stereo, it is preferable to drive the light-emitting device so as to form character information by the light emitting portions while non-light emitting portions are set as background.

Figure 9A:
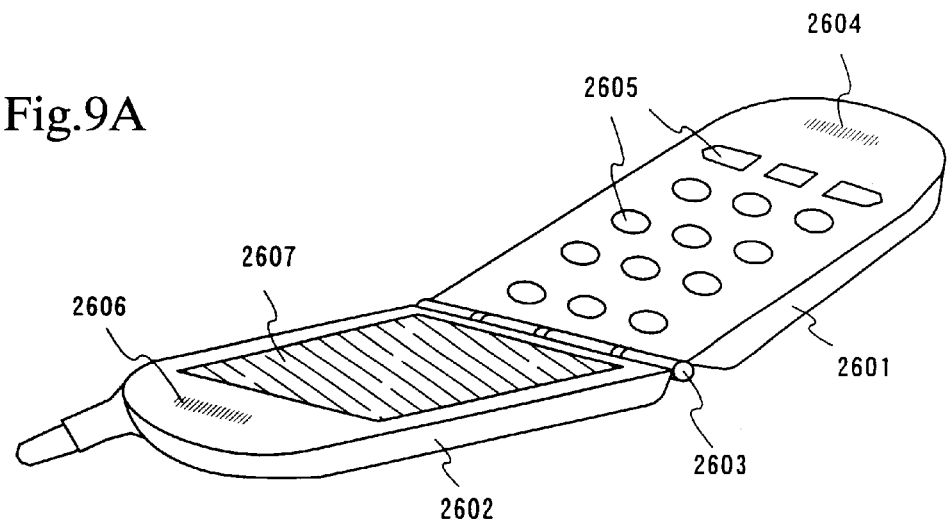
FIGS. 9A and 9B each shows another embodiment of the electric appliance.

Here, FIG. 9A shows a portable telephone, and reference numeral 2601 shows a portion (operation portion) which performs key operation, and reference numeral 2602 shows a portion which performs information display (information display portion), and the operation portion 2601 and the information display portion 2602 are connected by the connecting portion 2603. Further, the operation portion 2601 is provided with a sound input portion 2604, operation keys 2605, and the information display potion 2602 is provided with a sound output portion 2606, a display portion 2607.

The light-emitting device of this invention may be used as the display portion 2607. Note that, when using the light-emitting device to the display portion 2607, the consumption power of the portable telephone may be suppressed by displaying white letters in the background of the black color.

In the case of the portable telephone shown in FIG. 9A, the light-emitting device used in the display portion 2607 is incorporated with a sensor (a CMOS sensor), and may be used as an authentication system terminal for authenticating the user by reading the fingerprints or the hand of the user. Further, light emission may be performed by taking into consideration the brightness (illumination) of outside and making information display at a contrast that is already set.

Further, the low power consumption may be attained by decreasing the brightness when using the operating switch 2605 and increasing the brightness when the use of the operation switch is finished. Further, the brightness of the display portion 2607 is increased when a call is received, and low power consumption is attained by decreasing the brightness during a telephone conversation. Further, when using the telephone continuously, by making it have a function so that display is turned off by time control unless it is reset, low power consumption is realized. Note that these operation is performed by manual control.

Figure 9B:
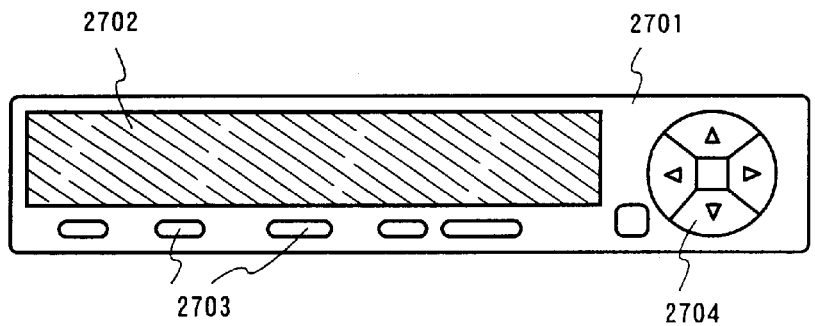

Further, FIG. 9B shows a car mounted audio, which includes a casing 2701, a display portion 2702, and operation switches 2703 and 2704. The light-emitting device of this invention can be applied to the display portion 2702. Further, in this embodiment, a car mounted audio (car audio) is shown as a sound reproduction equipment, but it may be used in a fixed type audio (audio component). Note that, when using a light-emitting device in the display portion 2704, by displaying white characters in a black background, power consumption may be suppressed.

As mentioned above, the application range of the present invention is extremely wide, and the invention can be applied to electric apparatuses in all fields. Further, electric apparatuses described in this embodiment may use a light-emitting device having any constitution shown in Examples 1 to 7.

As described above in detail, the present invention provides a light-emitting device that can enhance adhesion of a cathode and is particularly low in an image imperfection caused by a dark spot or delamination.

What is claimed is:

1. A light-emitting device comprising:
a thin film transistor over a substrate;
a resin interlayer insulating film over the thin film transistor and having a hardened uppermost surface; and
an electroluminescence element over said resin interlayer insulating film, said electroliminescence element comprising an anode, a polymer film provided on said anode, a low molecular weight film provided in contact with said polymer film and a cathode provided in contact with said low molecular weight film;
wherein an edge of said anode is covered with a resin film having an uppermost surface convered with a protective film comprising DLC.

2. A light-emitting device comprising:
a thin film transistor provided on an insulating surface; and
an electroluminescence element which is electrically connected with said thin film transistor,
a resin interlayer insulating film having an uppermost surface hardened over said thin film transistor, and
wherein said electroluminescence element comprises an anode, a polymer film provided on said anode, a low molecular weight film provided in contact with said polymer film and a cathode provided in contact with said low molecular weight film.

3. A light-emitting device comprising:
a thin film transistor provided on an insulating film; and
an electroluminescence element which is electrically connected with said thin film transistor,
wherein said electroluminescence element comprises an anode, a polymer film provided on said anode, a low molecular weight film provided in contact with said polymer film and a cathode provided in contact with said low molecular weight film, and
wherein an edge of said anode is covered with a resin film having an uppermost surface thereof being hardened.

4. A light-emitting device comprising:
a thin film transistor provided on an insulating surface; and
an electroluminescence element which is electrically connected with said thin film transistor,
a resin interlayer insulating film having an uppermost surface hardened over said thin film transistor,
wherein said electroluminescence element comprises an anode, a polymer film provided on said anode, a low molecular weight film provided in contact with said polymer film and a cathode provided in contact with said low molecular weight film, and
wherein an edge of said anode is covered with a resin film having an uppermost surface thereof being hardened.

5. A light-emitting device comprising:
a thin film transistor provided on an insulating surface; and
an electroluminescence element which is electrically connected with said thin film transistor,
wherein said electroluminescence element comprises an anode, a polymer film provided on said anode, a low molecular weight film provided in contact with said polymer film and a cathode provided in contact with said low molecular weight film, and
wherein an edge of said anode is covered with a resin film having an uppermost surface covered with a protective film.

6. A light-emitting device comprising:
a thin film transistor provided on an insulating surface; and
an electroluminescence element which is electrically connected with said thin film transistor,
a resin interlayer insulating film having an uppermost surface hardened over said thin film transistor,
wherein said electroluminescence element comprises an anode, a polymer film provided on said anode, a low molecular weight film provided in contact with said polymer film and a cathode provided in contact with said low molecular weight film, and
wherein an edge of said anode is covered with a resin film having an uppermost surface covered with a protective film.

7. A light-emitting device according to claim 1, wherein said polymer film is a luminescent layer and said low molecular weight film is an electron transport layer or an electron injection layer.

8. A light-emitting device according to claim 2, wherein said polymer film is a luminescent layer and said low molecular weight film is an electron transport layer or an electron injection layer.

9. A light-emitting device according to claim 3, wherein said polymer film is a luminescent layer and said low molecular weight film is an electron transport layer or an electron injection layer.

10. A light-emitting device according to claim 4, wherein said polymer film is a luminescent layer and said low molecular weight film is an electron transport layer or an electron injection layer.

11. A light-emitting device according to claim 5, wherein said polymer film is a luminescent layer and said low molecular weight film is an electron transport layer or an electron injection layer.

12. A light-emitting device according to claim 6, wherein said polymer film is a luminescent layer and said low molecular weight film is an electron transport layer or an electron injection layer.

13. An electronic apparatus comprising said light-emitting device according to claim 1, wherein said electronic apparatus is one selected from the group consisting of a video camera, a digital camera, a goggle type display, a navigation system, a personal computer, a portable information terminal.

14. An electronic apparatus comprising said light-emitting device according to claim 2, wherein said electronic apparatus is one selected from the group consisting of a video camera, a digital camera, a goggle type display, a navigation system, a personal computer, a portable information terminal.

15. An electronic apparatus comprising said light-emitting device according to claim 3, wherein said electronic apparatus is one selected from the group consisting of a video camera, a digital camera, a goggle type display, a navigation system, a personal computer, a portable information terminal.

16. An electronic apparatus comprising said light-emitting device according to claim 4, wherein said electronic apparatus is one selected from the group consisting of a video camera, a digital camera, a goggle type display, a navigation system, a personal computer, a portable information terminal.

17. An electronic apparatus comprising said light-emitting device according to claim 5, wherein said electronic apparatus is one selected from the group consisting of a video camera, a digital camera, a goggle type display, a navigation system, a personal computer, a portable information terminal.

18. An electronic apparatus comprising said light-emitting device according to claim 6, wherein said electronic apparatus is one selected from the group consisting of a video camera, a digital camera, a goggle type display, a navigation system, a personal computer, a portable information terminal.

19. A light emitting device according to claim 1, wherein the low molecular weight film comprises Alq3, TAZ, TPOB, BeBq2 or PySPy.

20. A light emitting device according to claim 2, wherein the low molecular weight film comprises Alq3, TAZ, TPOB, BeBq2 or PySPy.

21. A light emitting device according to claim 3, wherein the low molecular weight film comprises Alq3, TAZ, TPOB, BeBq2 or PySPy.

22. A light emitting device according to claim 4, wherein the low molecular weight film comprises Alq3, TAZ, TPOB, BeBq2 or PySPy.

23. A light emitting device according to claim 5, wherein the low molecular weight film comprises Alq3, TAZ, TPOB, BeBq2 or PySPy.

24. A light emitting device according to claim 6, wherein the low molecular weight film comprises Alq3, TAZ, TPOB, BeBq2 or PySPy.

* * * * *